United States Patent
Yang et al.

(10) Patent No.: US 9,653,344 B2
(45) Date of Patent: May 16, 2017

(54) DEVICE ISOLATION STRUCTURE AND MANUFACTURE METHOD

(71) Applicant: SEMICONDUCTOR MANUFACTURING INTERNATIONAL (SHANGHAI) CORPORATION, Shanghai (CN)

(72) Inventors: Guangli Yang, Shanghai (CN); Xianyong Pu, Shanghai (CN); Li Liu, Shanghai (CN); Chihchung Tai, Shanghai (CN); Gangning Wang, Shanghai (CN); Hong Sun, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/882,452

(22) Filed: Oct. 13, 2015

(65) Prior Publication Data

US 2016/0111321 A1    Apr. 21, 2016

(30) Foreign Application Priority Data

Oct. 16, 2014  (CN) .......................... 2014 1 0548682

(51) Int. Cl.
*H01L 29/06* (2006.01)
*H01L 21/762* (2006.01)

(52) U.S. Cl.
CPC .. *H01L 21/76237* (2013.01); *H01L 21/76286* (2013.01)

(58) Field of Classification Search
CPC ............. H01L 29/0643; H01L 29/0646; H01L 29/0649; H01L 2027/11829; H01L 21/762; H01L 21/76237; H01L 21/76286
See application file for complete search history.

(56) References Cited

U.S. PATENT DOCUMENTS

| 7,256,119 B2 * | 8/2007 | Grivna | H01L 21/743 257/E21.537 |
| 8,513,087 B2 * | 8/2013 | Disney | H01L 29/732 257/E21.375 |
| 2015/0179734 A1 * | 6/2015 | Guowei | H01L 29/0649 257/506 |

* cited by examiner

*Primary Examiner* — Cuong Q Nguyen
(74) *Attorney, Agent, or Firm* — Kilpatrick Townsend & Stockton LLP

(57) ABSTRACT

A method for forming a semiconductor device includes forming a buried doped layer in a semiconductor substrate and forming a plurality of first trenches that expose the buried doped layer. A first dielectric layer is formed covering sidewalls of the first trenches, and a doped polysilicon layer is formed covering side surfaces of the first dielectric layer and bottom portions of the first trenches. The method also includes forming a second trench in each of the plurality of first trenches, each second trench extending through a bottom portion of the doped polysilicon layer and the buried doped layer into a lower portion of the substrate. The method also includes forming a second dielectric layer inside each second trench. An isolation pocket structure is formed that includes the doped buried layer at the bottom and sidewalls that includes the doped polysilicon layer sandwiched between the first and second dielectric layers.

10 Claims, 6 Drawing Sheets

DEVICE ISOLATION STRUCTURE AND MANUFACTURE METHOD

CROSS-REFERENCES TO RELATED APPLICATIONS

This application claims priority to Chinese patent application No. 201410548682.X, filed on Oct. 16, 2014, the content of which is incorporated herein by reference in its entirety.

BACKGROUND OF THE INVENTION

The present invention relates to the field of semiconductor technology. Specifically, embodiments of the invention relate to semiconductor device isolation structures and manufacturing methods.

In analog integrated circuits (IC), in order to obtain good noise immunity, a junction isolation pocket with a buried implant layer can be formed within the substrate. FIG. 1 is a cross-sectional diagram illustrating a conventional semiconductor device in a semiconductor substrate 100. As shown in FIG. 1, a device 103 is disposed in an isolation pocket having a doped polysilicon 102 in a deep trench structure at the side of a buried layer 101.

However, the inventors have observed that subsequent thermal processing can cause diffusion in the buried layer and out-diffusion from the doped polysilicon in the isolation pocket. These diffusion regions can impose a limit on device spacing and lead to larger die size of the integrated circuit.

Therefore, an improved device isolation method and structure is highly desirable.

BRIEF SUMMARY OF THE INVENTION

Embodiments of the present invention provide an isolation pocket structure and method of fabrication. In an embodiment, a dielectric layer is disposed in the deep trench lined with heavily doped polysilicon. The dielectric material in deep trenches avoids breakdown or punch-through between devices and the doped polysilicon. The doped poly can be used as electrical pickup for applying a potential to the buried layer for junction isolation between the buried layer and substrate in the vertical direction. The dielectric layer and the anti-type dopant below the dielectric layer could offer additional isolation between two pockets at lateral direction. The fabrication steps are simple and create good isolation in a relatively small dimension. The lateral direction isolation is provided by the dielectric layer instead of junctions, which can reduce the dimension, enhance the noise immunity, and reduce cross-talks and latch-up.

According to some embodiments of the invention, a method for forming a semiconductor device includes forming a buried doped layer in a semiconductor substrate and forming a plurality of first trenches that expose the buried doped layer. A first dielectric layer is formed covering sidewalls of the first trenches, and a doped polysilicon layer is formed covering side surfaces of the first dielectric layer and bottom portions of the first trenches. The method also includes forming a second trench in each of the plurality of first trenches, and each second trench extending through a bottom portion of the doped polysilicon layer and the buried doped layer into a lower portion of the substrate. The method also includes forming a second dielectric layer inside each second trench. An isolation pocket structure is formed that includes the doped buried layer at the bottom and sidewalls that includes the doped polysilicon layer sandwiched between the first and second dielectric layers.

In some embodiments, the method also includes implanting dopants through the second trench to form a doped region at a lower end of the second trench.

In some embodiments, dopants in the doped polysilicon layer have the same dopant type as dopants in the doped buried layer.

In some embodiments, forming a buried doped layer includes providing a first semiconductor substrate, forming a doped layer in a surface region of the first semiconductor substrate, and using an epitaxial process to form a semiconductor layer on the first semiconductor substrate.

In some embodiments, forming a first dielectric covering sidewalls of the first trenches includes forming a first dielectric covering sidewalls and bottom portions of the first trenches and removing the portion of the first dielectric covering the bottom portions of the first trenches.

In some embodiments, the second dielectric is disposed between two adjacent isolation pocket structures.

According to some embodiments of the present invention, a semiconductor apparatus includes an isolation pocket structure in a semiconductor substrate and an electronic component disposed in the isolation pocket structure. The isolation pocket structure has a bottom layer and sidewalls. The bottom layer includes a buried doped layer, and the sidewalls include a first dielectric layer, a doped polysilicon layer, and a second dielectric layer. The doped polysilicon layer is sandwiched between the first and second dielectric layers and is connected to the buried doped layer.

In some embodiments, the isolation pocket structure also includes a second doped region at a lower end of the second dielectric layer which extends below the doped buried layer.

In some embodiments, the second doped region includes dopants that have an opposite doping type as the dopants in the doped polysilicon layer.

In some embodiments, the doped buried layer includes dopants that have an opposite doping type as the dopants in the doped polysilicon layer.

In some embodiments, the second dielectric is disposed between two adjacent isolation pocket structures.

According to some other embodiments of the present invention, an electronic apparatus includes a semiconductor device disposed in an isolation pocket structure and electronic components connected to the semiconductor device. The isolation pocket structure has a bottom layer and sidewalls. The bottom layer includes a buried doped layer, and the sidewalls include a first dielectric layer, a doped polysilicon layer, and a second dielectric layer. The doped polysilicon layer is sandwiched between the first and second dielectric layers and is connected to the buried doped layer.

In some embodiments, the isolation pocket structure also includes a second doped region at a lower end of the second dielectric layer which extends below the doped buried layer.

In some embodiments, the second doped region includes dopants that have an opposite doping type as the dopants in the doped polysilicon layer.

In some embodiments, the doped buried layer includes dopants that have an opposite doping type as the dopants in the doped polysilicon layer.

In some embodiments, the second dielectric is disposed between two adjacent isolation pocket structures.

As described above, the fabrication steps are simple and provide effective isolation in relatively small dimensions. The dielectric material can avoid breakdown or punch-through between devices and the buried pick-up doped poly. The doped poly picks up the buried layer and force potential onto the buried layer which will offer junction isolation between the buried layer and substrate at vertical direction. Before the dielectric layer deposition, anti-type dopant is implanted at the bottom of the trench. The anti-type dopant and the dielectric layer could offer the isolation between two pockets in the lateral direction. As a result, the lateral direction isolation is blocked by the dielectric layer instead of the junction, which will reduce the device dimension. Devices can be disposed into the isolation pocket structure, which could enhance noise immunity and reduce cross-talks and latch up.

The following description, together with the accompanying drawings, will provide further understanding of the nature and advantages of the claimed invention.

DETAILED DESCRIPTION OF THE INVENTION

Figure 1:
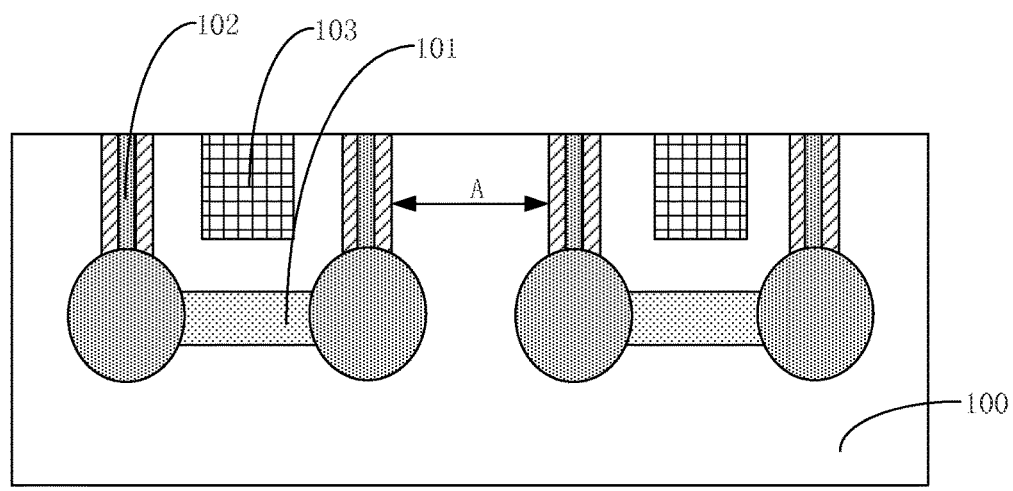
FIG. 1 is a cross-sectional diagram illustrating a conventional semiconductor device.

Embodiments of the present invention provide an isolation structure, its manufacturing method, and related electronic devices.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations in the illustrated shapes resulting, for example, from manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on" "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," "having" and variants thereof, when used in this specification, specify the presence of stated features, steps, operations, elements, and/or components, but do not, preclude the presence or addition of one or more other features, steps, operations, elements, components, and/or groups thereof. Furthermore, as used herein, the words "and/or" may refer to and encompass any possible combinations of one or more of the associated listed items.

The use of the terms "first," "second," etc. do not denote any order, but rather the terms "first," "second," etc. are used to distinguish one element from another. Furthermore, the use of the terms "a," "an," etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above, Embodiments of the invention are described herein with reference to cross-section illustrations that are schematic illustrations of idealized embodiments (and intermediate structures) of the invention. For example, an implanted region illustrated as a rectangle will typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on," "side" (as in "sidewall"), "below", "above," "higher," "lower," "over," and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 2A:
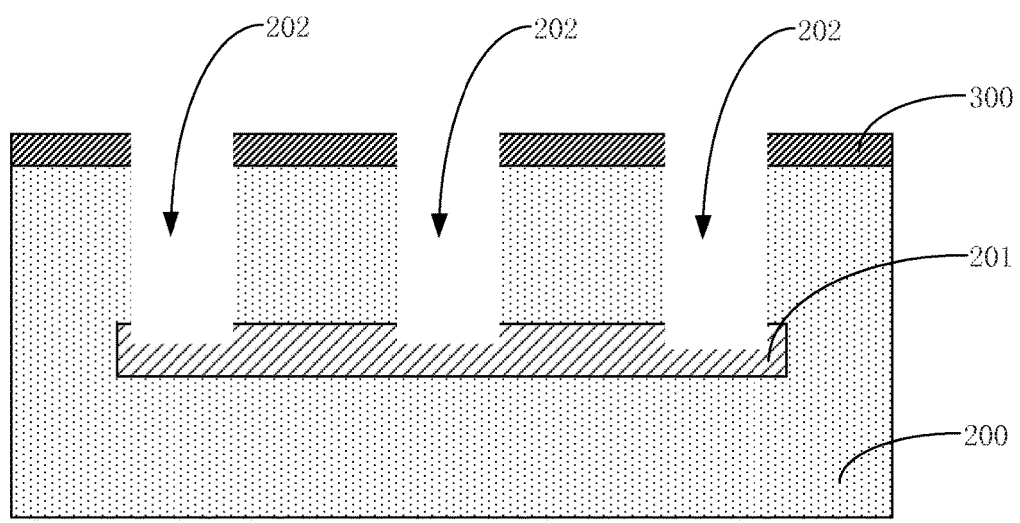
FIGS. 2A, 2B, 2C, 2D, 2E, and 2F are cross-sectional diagrams illustrating a method for forming a semiconductor device according to an embodiment of the present invention.
Figure 2B:
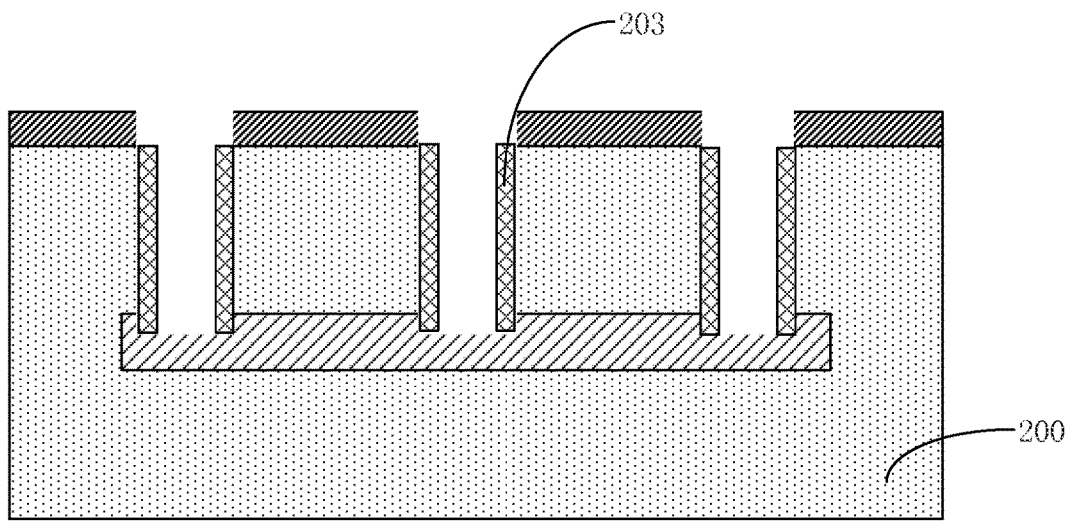
Figure 2C:
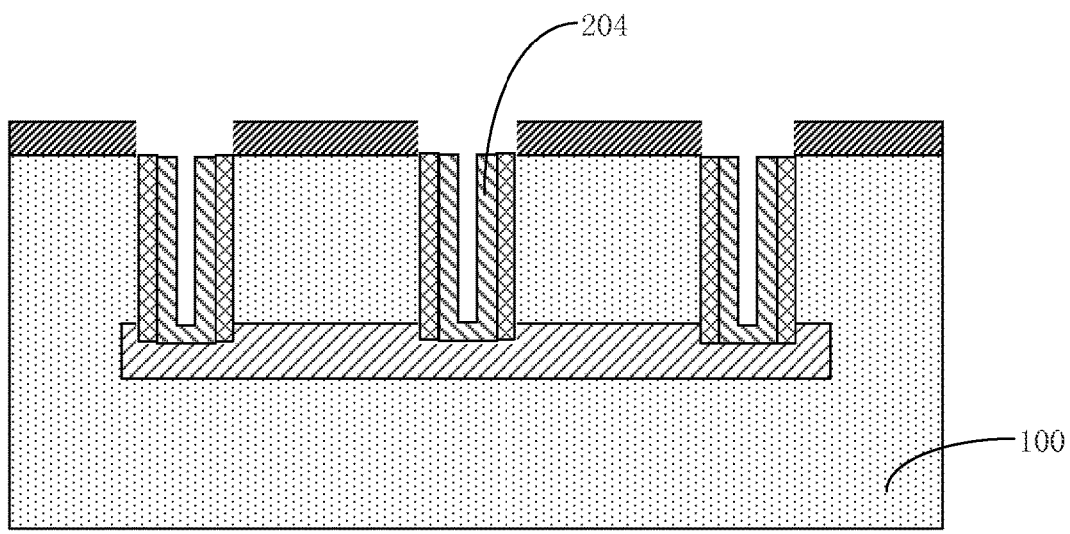
Figure 2D:
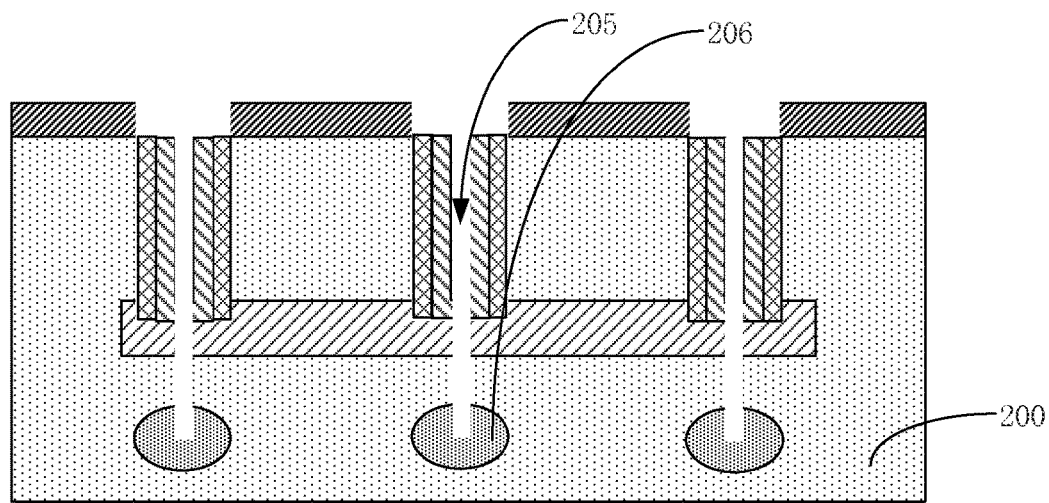
Figure 2E:
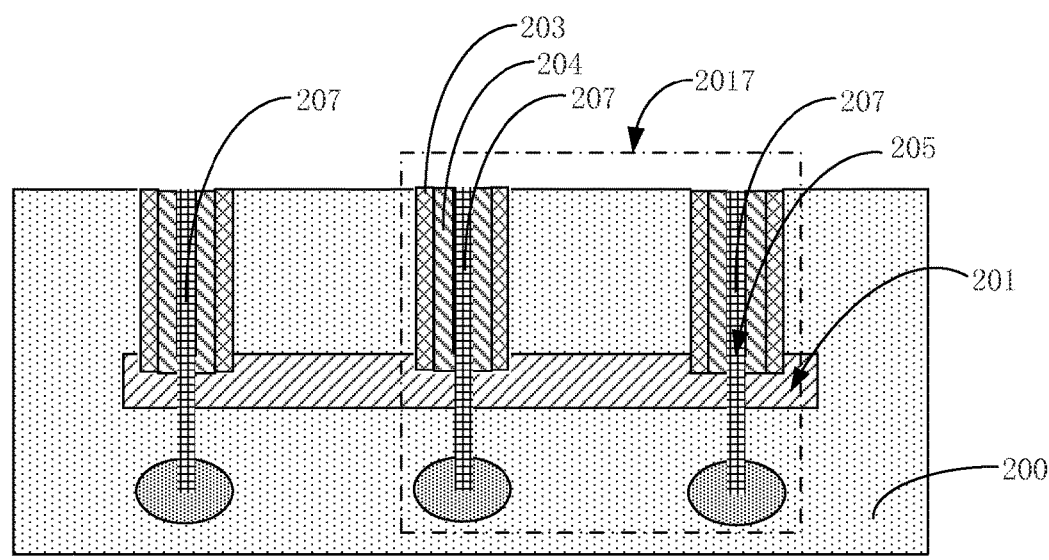
Figure 2F:
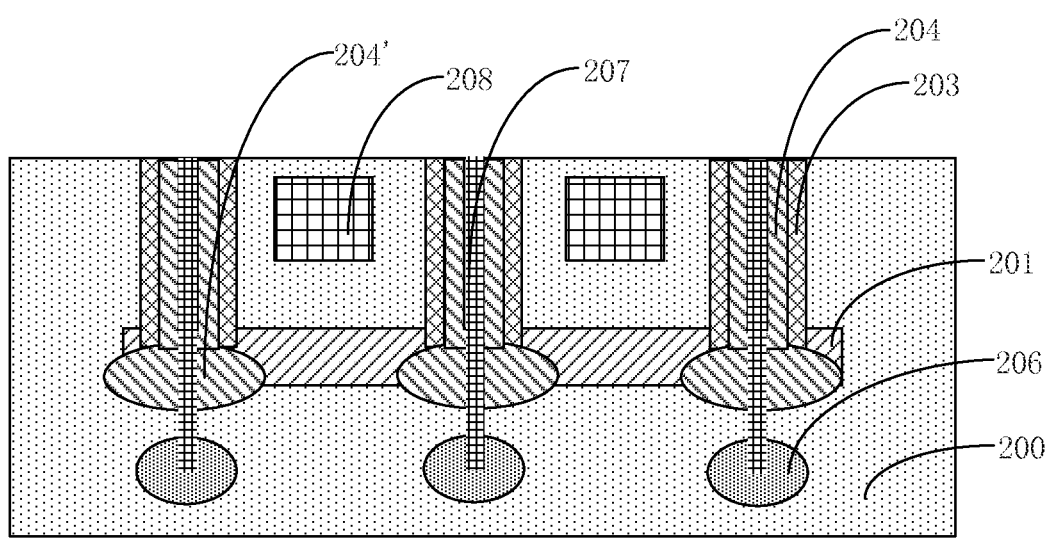
Figure 3:
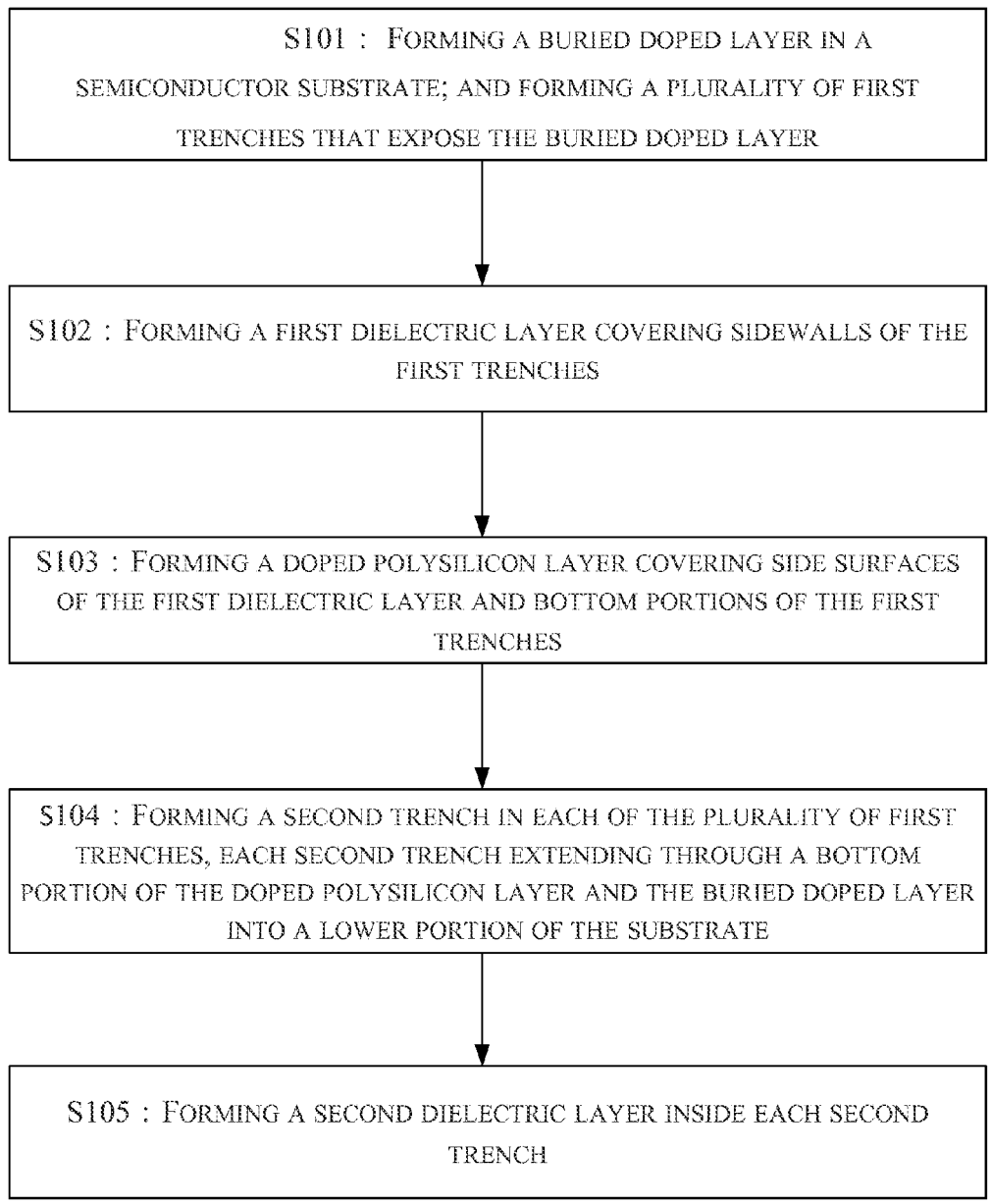
FIG. 3 is a simplified flowchart illustrating a method for forming a semiconductor device according to an embodiment of the present invention.

FIGS. 2A, 2B, 2C, 2D, 2E, and 2F are cross-sectional diagrams illustrating a method for forming a semiconductor device according to an embodiment of the present invention, and FIG. 3 is a simplified flowchart illustrating a method for forming a semiconductor device according to an embodiment of the present invention. The method is now described with reference to the steps in the flowchart of FIG. 3 and the reference numerals in FIGS. 2A-2F.

At step A1, as shown in FIG. 2A, the method starts with a substrate 200 that includes a layer of doped impurities 201. A plurality of trenches 202 are formed in the substrate using a hard mask 300. The trenches extend into the substrate and expose a top portion of doped layer 201. In some embodiments, the doped layer can be formed using ion implantation, and ions of either N-type or P-type can be used. In some embodiments, doped layer 201 is used as a buried layer. Hard mask 300 can include silicon nitride or other suitable materials, and the trenches can be formed using dry etch or other suitable methods.

In step A1, the substrate with a layer of doped impurities can be formed using the following method.

Sub-step A11: Start with a first substrate, and form a doped layer adjacent to a top surface of the first substrate using ion implantation.

Sub-step A12: Form an epitaxial semiconductor layer over the first substrate to form substrate 200. The implanted doped layer now forms the layer of doped impurities 201.

At step A2, as shown in FIG. 2B, a first dielectric layer 203 is formed covering sidewalls of trenched 202. In some embodiments, a dielectric layer is formed covering the sidewalls and the bottom of trenches 202; then the portion of the dielectric covering the trench bottoms is removed. First dielectric layer 203 can include silicon oxide, silicon nitride, or other suitable materials, and an anisotropic etch process can be used to form first dielectric layer 203 on the sidewalls of the trenches.

At step A3, as shown in FIG. 2C, a doped polysilicon layer 204 is formed covering the first dielectric layer 203 on the sidewalls of the trenches and the bottom of the trenches.

Polysilicon layer 204 can be formed by deposition or other suitable methods. Polysilicon layer 204 is doped with the same type of dopants as doped layer 201. Doped polysilicon layer 204 is in contact with doped layer 201, and can provide a conduction path to an external applied voltage.

At step A4, as shown in FIG. 2D, second trenches 205 are formed etching through the bottom portions of doped polysilicon layer 204, the doped layer 201, and further etching into substrate 200 below doped layer 201. Next, doped regions 206 are formed at the bottom of second trenches 205. Doped regions 206 can be formed by implanting dopants with the same type of dopants as doped polysilicon layer 204. At step A4, second trenches 205 can be formed using dry etching or other suitable etching method. As shown in FIG. 2D, second trenches 205 are formed in the center region of first trenches 202 and extend through doped region 201 and into doped regions 206. Step A4 can also include removing hard mask layer 300.

At step A5, as shown in FIG. 2E, a second dielectric layer 207 is formed inside second trenches 205. In some embodiments, second dielectric layer 207 can be formed using a deposition process and followed by a planarization process. Second dielectric layer 207 can include silicon oxide, silicon nitride, or other suitable materials. Second dielectric layer 207 can be formed using the same material as first dielectric layer 203.

As shown in the dotted region in FIG. 2E, two adjacent second dielectric layers 207 inside second trenches 205 and a portion of doped layer 201 form an isolation packet structure 2017. Alternative, isolation packet structure 2017 can also include doped polysilicon layer 204 and first dielectric layer 203 that are included in the dotted region in FIG. 2E.

At step A6, as shown in FIG. 2F, an electronic component 208 is formed inside isolation packet structure 2017. Electronic component 208 may be an analog device or a variety of other possible devices. In this embodiment, isolation packet structure 2017 surrounds electronic component 208 at the sides and the bottom, which can improve the noise immunity of the electronic components, and reduce crosstalk and latch effect.

As shown in FIG. 2F, doped layer 201 isolates electronic component 208 from lower portions of semiconductor substrate 200. First dielectric layer 203 isolates doped polysilicon layer 204 from electronic components 208. Doped polysilicon layer 204 can be used as an electrical pickup region for applying a voltage to doped layer 201 to form junction isolation. Second dielectric layers 207 can be used to isolate adjacent isolation packet structures 2017.

In the process of forming an electronic element 208, the various thermal processes will cause dopant diffusion from polysilicon layer 204 to form doped diffusion region 204', as shown in FIG. 2F. However, second dielectric layer 207 and ion implanted region 206 may prevent diffusion of dopant ions from doped polysilicon layer 204 in the horizontal direction. As a result, doped diffusion region 204' will not spread to adjacent isolation pockets. Therefore, there is no need, as in the prior art, to increase the distance between two adjacent isolation pockets to ensure the isolation. It is possible to reduce the size of the semiconductor device. In addition, two adjacent spacers 207 may share the same second dielectric layer 207, and it is possible to further reduce the size of the semiconductor, while ensuring device isolation.

In some embodiments of the present invention, doped regions 206 can be omitted. The presence of second dielectric layer 207 can prevent the dopants from doped polysilicon layer 204 from diffusing in the horizontal direction, thereby ensuring the isolation, while reducing the size of the semiconductor device.

The method described above can be summarized in the flowchart in FIG. 3. The method for forming a semiconductor device includes the following steps.

Step S101: Providing a semiconductor substrate including a buried doped layer, and forming a plurality of first trenches that expose the buried doped layer;

Step S102: Forming a first dielectric covering sidewalls of the first trenches;

Step S103: Forming a doped polysilicon layer covering side surfaces of the first dielectric layer and bottom portions of first trenches;

Step S104: Forming a second trench in each of the plurality of first trenches, each second trench extending through a bottom portion of the doped polysilicon layer and the buried doped layer into a lower portion of the substrate;

Step S105: Forming a second dielectric layer inside each second trench.

In the method described above, an isolation pocket structure is formed that includes the doped buried layer at the bottom and sidewalls that includes the doped polysilicon layer sandwiched between the first and second dielectric layers. In some embodiments, the second dielectric layers in adjacent second trenches along with the doped buried layer form an isolation pocket structure. In some embodiments, the first trench can form an enclosed region, e.g., a rectangular region, in the substrate. In this case, the second dielectric layer in the enclosed trench and the doped buried layer form an isolation pocket structure that is isolated from the substrate on four sides and the bottom. In some embodiments, the method can also include forming an electronic component in the isolation pocket structure.

Figure 4:
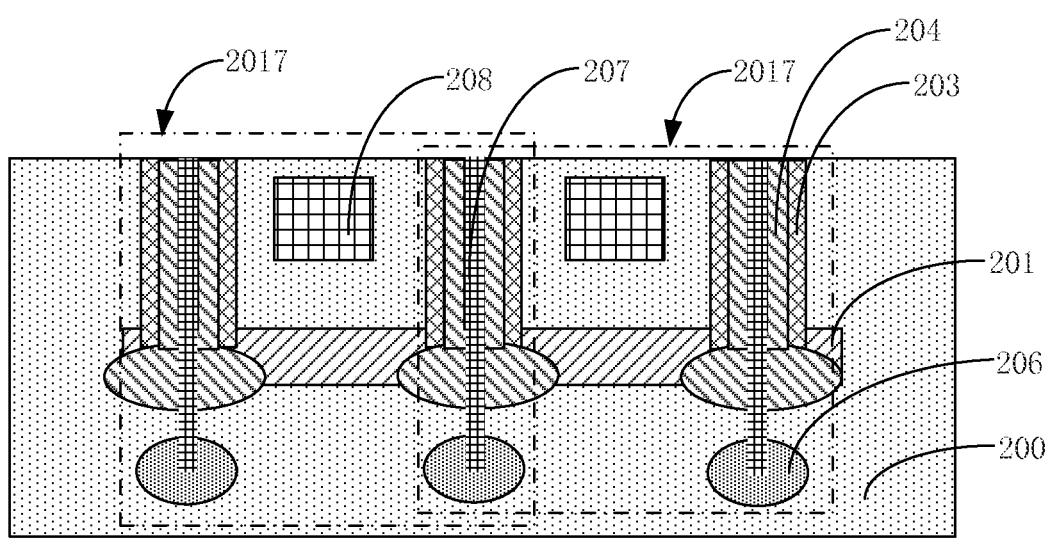
FIG. 4 is a cross-sectional diagram illustrating a semiconductor device according to an embodiment of the present invention.

FIG. 4 is a cross-sectional diagram illustrating a semiconductor device according to an embodiment of the present invention. As shown in FIG. 4, the semiconductor device includes a semiconductor substrate having an isolation pocket structure 2017 disposed therein, and an electronic component 208 disposed in the isolation pocket structure. The isolation pocket structure includes a bottom layer and sidewalls. The bottom layer includes a buried doped layer 201, and the sidewalls include a first dielectric layer 203, a doped polysilicon layer 204, and a second dielectric layer 207. In an embodiment, isolation pocket structure 2017 also includes a second doped region 206 at the lower end of second dielectric layer 207 which extends below the doped buried layer. Second doped region 206 includes dopants that have an opposite doping type as the dopants in the doped polysilicon layer 204. Doped buried layer 201 includes dopants that have an opposite doping type as the dopants in the doped polysilicon layer 204, which can be used for connecting doped buried layer 201 to an external voltage. In some embodiments, adjacent isolation pocket structure 2017 can share a common second dielectric layer 207. The presence of doped buried layer 201 and second dielectric layer 207 can provide device isolation, while reducing the size of the semiconductor device. The device shown in FIG. 4 can be formed using the method described above in connection to FIGS. 2A-2F and FIG. 3.

Thus, embodiments of the present invention provide an isolation pocket structure that includes a bottom doped buried layer and sidewalls that includes a doped polysilicon layer sandwiched between a first and second dielectric layers that can provide effective device isolation. The doped polysilicon layer further provides a pickup connection to the doped buried layer, enabling an external voltage to be applied to provide further junction isolation. The second dielectric layer separates adjacent isolation pocket structures, blocking the out-diffusion from the doped polysilicon layers and allowing small device sizes. Moreover, adjacent isolation pocket structures can share the second dielectric layer, further reducing the device size.

Embodiments of the present invention also provide an electronic apparatus that includes the above-described isolation pocket structure. The electronic apparatus can include a semiconductor device formed in an isolation pocket structure and electronic components connected to the semiconductor device. The semiconductor device includes a semiconductor device formed using the manufacturing method described above, or a semiconductor device described above. The electronic component can include discrete devices and integrated circuits, or other electronic components.

By including the isolation pocket structure, the electronic apparatus can have excellent performance, with the advantages described above. The electronic device may include a mobile phone, tablet PCs, laptops, netbooks, game consoles, televisions, VCD, DVD, navigation, camera, video camera, voice recorder, MP3, MP4, PSP, and other electronic products or equipment. Embodiments of the present invention also provide intermediate products having the above-described semiconductor device, for example: a mobile phone motherboard that includes the integrated circuit, and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor apparatus, comprising:
   an isolation pocket structure in a semiconductor substrate; and
   an electronic component disposed in the isolation pocket structure;
   wherein the isolation pocket structure has a bottom layer and sidewalls,
   the bottom layer includes a buried doped layer, and the sidewalls include a first dielectric layer, a doped polysilicon layer, and a second dielectric layer, the doped polysilicon layer being sandwiched between the first and second dielectric layers and being connected to the buried doped layer.

2. The apparatus of claim 1, wherein the isolation pocket structure also includes a second doped region at a lower end of second dielectric layer which extends below the doped buried layer.

3. The apparatus of claim 2, wherein the second doped region includes dopants that have an opposite doping type as the dopants in the doped polysilicon layer.

4. The apparatus of claim 1, wherein the doped buried layer includes dopants that have an opposite doping type as the dopants in the doped polysilicon layer.

5. The apparatus of claim 1, wherein the second dielectric is disposed between two adjacent isolation pocket structures.

6. An electronic apparatus, comprising:
   a semiconductor device disposed in an isolation pocket structure and electronic components connected to the semiconductor device;
   wherein the isolation pocket structure has a bottom layer and sidewalls,
   the bottom layer includes a buried doped layer, and the sidewalls include a first dielectric layer, a doped polysilicon layer, and a second dielectric layer, the doped polysilicon layer being sandwiched between the first and second dielectric layers and being connected to the buried doped layer.

7. The apparatus of claim 6, wherein the isolation pocket structure also includes a second doped region at a lower end of second dielectric layer which extends below the doped buried layer.

8. The apparatus of claim 7, where the second doped region includes dopants that have an opposite doping type as the dopants in the doped polysilicon layer.

9. The apparatus of claim 6, where the doped buried layer includes dopants that have an opposite doping type as the dopants in the doped polysilicon layer.

10. The apparatus of claim 6, where the second dielectric is disposed between two adjacent isolation pocket structures.

* * * * *